(12) United States Patent
Kerber (10) Patent No.: US 7,105,853 B2
(45) Date of Patent: Sep. 12, 2006

(54) SELF-ALIGNED JUNCTION PASSIVATION FOR SUPERCONDUCTOR INTEGRATED CIRCUIT

(75) Inventor: George L. Kerber, San Diego, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/814,512

(22) Filed: Apr. 1, 2004

(65) Prior Publication Data

US 2004/0183065 A1    Sep. 23, 2004

Related U.S. Application Data

(62) Division of application No. 10/364,981, filed on Feb. 12, 2003.

(51) Int. Cl.
*H01L 39/22* (2006.01)

(52) U.S. Cl. .................. 257/31; 257/30; 257/32; 257/E39.014

(58) Field of Classification Search .......... 257/30, 257/31, 32, E39.014; 438/2
See application file for complete search history.

(56) References Cited

U.S. PATENT DOCUMENTS 6,188,084 B1 *   2/2001   Kerber et al. ................. 257/30

OTHER PUBLICATIONS

Merriam-Webster's Collegiate Dictionary, Tenth Edition; copyright 1999; p. 319.*

H. Kroger et al., "Selective Niobium Anodization Process for Fabricating Josephson Tunnel Junctions," *Appl. Phys. Lett.* 39(3), Aug. 1, 1981, pp. 280-282.
S. Morohashi et al., "Self-aligned Contact Process for Nb/AlOx/Nb Josephson Junctions," *Appl. Phys. Lett.* 48(3), Jan. 20, 1986, pp. 254-256.
Y. Tarutani et al., "Niobium-Based Integrated Circuit Technologies," *Proceedings of the IEEE*, vol. 77, No. 8, Aug. 1989, pp. 1164-1175.
L. Lee et al., "RHEA Process for Fine-Geometry Josephson Junction Fabrication," *IEEE Transactions on Magnetics*, vol. 27, No. 2, Mar. 1991, pp. 3133-3136.
T. Imamura et al., "A Submicrometer Nb/AlOx/Nb Josephson Junction," *J. Appl. Phys. Lett.* 64(3), Aug. 1, 1988, pp. 1586-1588.
S. Hasuo, "High-Speed Josephson Integrated Circuit Technology," *IEEE Trans. Magn.*, v. 25, No. 2, Mar. 1989, pp. 740-749.
X. Meng et al., "Very Small Critical Current Spreads in Nb/Al-AlOx/Nb Integrated Circuits Using Low-Temperature and Low Stress ECR PECVD Silicon Oxide Films," *IEEE Trans. Appl. Supercon.*, v. 9, No. 2, Jun. 1999, pp. 3208-3211.
A. Bhat et al., "A 10 GHz Digital Amplifier in an Ultra-Small-Spread High-Jc Nb/AlOx/Nb Integrated Circuit Process," *IEEE Trans. Appl. Supercon.*, v. 9, No. 2, Jun. 1999, pp. 3232-3236.

* cited by examiner

*Primary Examiner*—N. Drew Richards
(74) *Attorney, Agent, or Firm*—Posz Law Group, PLC (57) ABSTRACT

A superconductor integrated circuit (1) includes an anodization ring (35) disposed around a perimeter of a tunnel junction region (27) for preventing a short-circuit between an outside contact (41) and the base electrode layer (18). The tunnel junction region (27) includes a junction contact (31) with a diameter of approximately 1.00 μm or less defined by a top surface of the counter electrode layer (24). The base electrode layer (18) includes an electrode isolation region (36) disposed approximately 0.8 μm in horizontal distance from the junction contact (31) for providing device isolation.

11 Claims, 7 Drawing Sheets

SELF-ALIGNED JUNCTION PASSIVATION FOR SUPERCONDUCTOR INTEGRATED CIRCUIT

This application is a divisional application of U.S. patent application Ser. No. 10/364,981, filed on Feb. 12, 2003, the contents of which are incorporated herein by reference.

FIELD OF THE INVENTION

The present invention relates generally to superconductor integrated circuits and, more particularly, to a superconductor integrated circuit with a reduced Josephson junction diameter and a fabrication method thereof.

BACKGROUND OF THE INVENTION

The diameter of a Josephson junction (junction) in a superconductor integrated circuit (IC) should be the smallest definable feature in order to obtain maximum circuit performance. This diameter should be limited by only the resolution of the lithography tool and the etch tool. However, the diameter of the junction in a conventional superconductor IC is limited by the diameter (or surface area) of its contact. More specifically, in a conventional superconductor IC, the junction diameter must be greater than the diameter of its contact in order to prevent an unwanted short circuit between wire layers. As a result, the minimum junction diameter is determined by the minimum contact diameter plus approximately two times the alignment tolerance from the lithography tool.

For example, the minimum junction diameter in a conventional superconductor IC must be approximately 50% larger than the contact diameter for high yield in accordance with alignment tolerances of existing lithography tools. As a result, a 1.5 µm diameter junction requires a contact diameter of no greater than 1.0 µm to permit an alignment error of +/−0.25 µm. However, even if the alignment tolerances were significantly improved, the junction diameter would still have to be greater than the contact diameter. This is because a junction contact that is larger in diameter than the junction diameter in a conventional superconductor IC can result in unwanted short circuits between wire layers.

If the relationship between the junction diameter and the contact diameter were significantly decoupled, the junction diameter would become the minimum size feature. The junction diameter would then be reduced to 1.0 µm or smaller in accordance with generally accepted design rules. This would lead to an increase in the current density of the critical current by a factor of 2.25. Because the circuit speed scales with the square root of the current density, the circuit speed would be increased by approximately 50%.

Accordingly, an object of the present invention is to provide a superconductor IC fabrication method for producing a superconductor IC with a minimum size diameter junction.

A further object of the present invention is to provide a superconductor IC fabrication method requiring limited additional fabrication.

A further object of the present invention is to provide a superconductor IC device that prevents unwanted short circuits between wiring layers.

BRIEF SUMMARY OF THE INVENTION

According to the present invention, a method of fabricating a superconductor IC from a trilayer includes etching the counter electrode layer for forming a tunnel junction region and for exposing a portion of the tunnel barrier layer. The tunnel junction region includes an unetched portion of the counter electrode layer, an unexposed portion of the tunnel barrier layer and an upper portion of the base electrode facing an inner periphery surface of the unexposed portion of the tunnel barrier layer. Next, the exposed portion of the tunnel barrier layer, sidewall portions of the tunnel junction region and a portion of the base electrode are anodized for forming an anodized tunnel barrier, an anodized tunnel junction region, an anodized base layer and a junction contact (anodization layer). Finally, the anodization layer is etched for forming an anodization ring surrounding the tunnel junction region. The etching of the counter electrode layer and the anodizing of the tunnel barrier are both performed over a first junction mask. The etching of the anodization layer is performed over a second junction mask.

A superconductor integrated circuit fabricated according to the above method includes a base electrode layer, a tunnel barrier layer disposed above the base electrode layer, a counter electrode layer disposed above the tunnel barrier layer, and an anodization ring disposed around a perimeter of the counter electrode layer and a perimeter of the tunnel barrier layer. The anodization ring is for preventing a short circuit between an outside contact and the base electrode layer. A tunnel junction region is defined by the counter electrode layer, tunnel barrier layer and the base electrode layer. The tunnel junction region includes a junction contact having a diameter of approximately 1.00 µm defined by a top surface of the counter electrode layer. The base electrode layer includes an electrode isolation region disposed approximately 0.8 µm in horizontal distance from the junction contact for providing device isolation.

The superconductor integrated circuit further includes a masked oxide layer disposed above the base electrode layer and the anodization ring for defining an outside contact via and a base electrode via.

Because of the anodization ring provided by the methodology of the present invention, the diameter of the outside contact via may be greater than the diameter of the junction.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF THE INVENTION

Referring now to the drawings in which like numerals reference like parts, a method of fabricating a superconductor integrated circuit (IC) will be discussed with reference to the flow diagram of FIG. 10 and the various cross-section views of FIGS. 1–9B.

Figure 1:
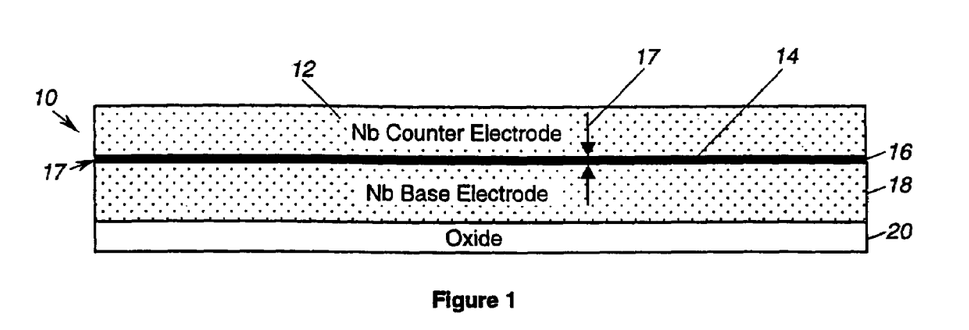
FIG. 1 is a cross-section side elevation view of a trilayer deposited over an oxide layer according to a preferred methodology.
Figure 10:
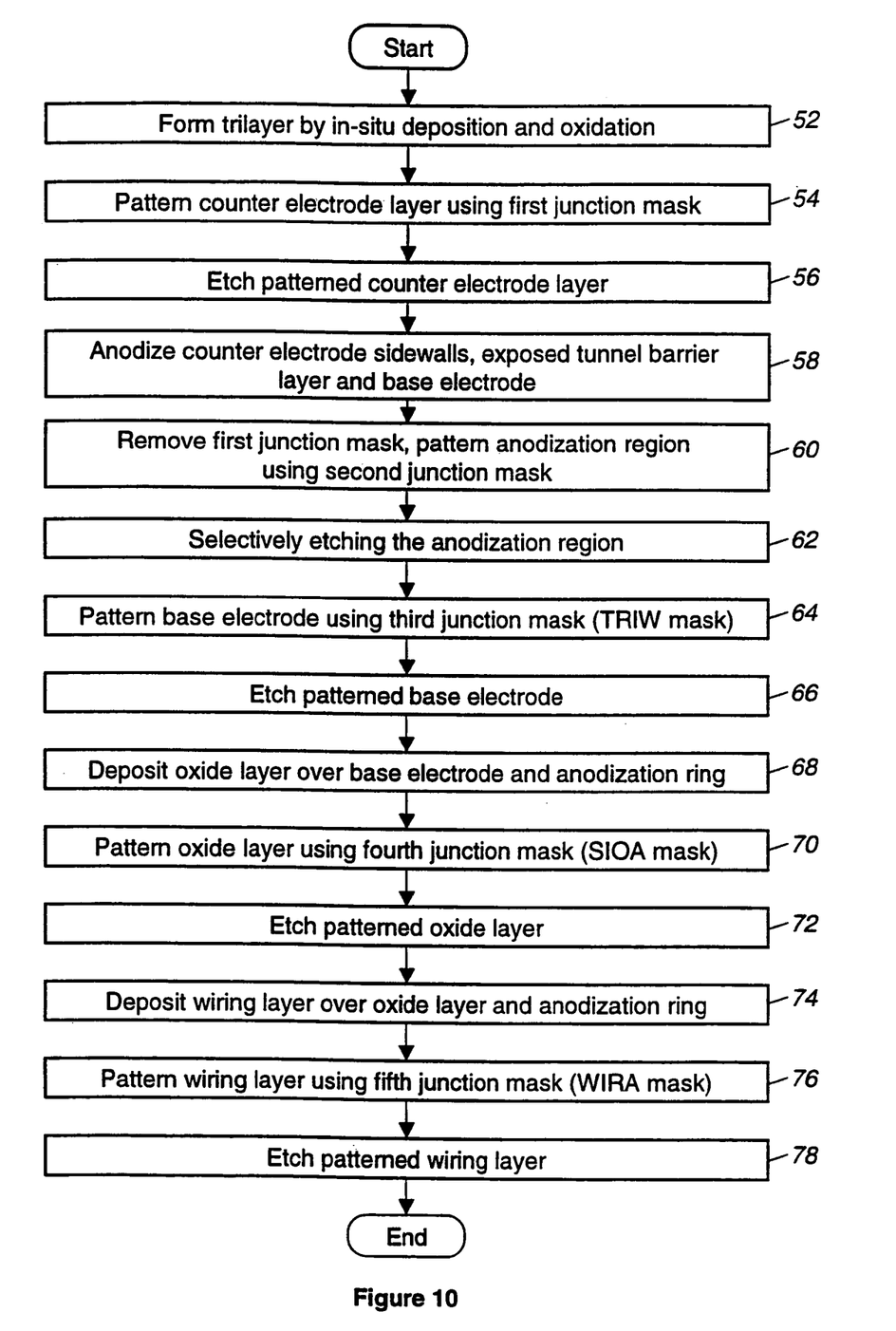
FIG. 10 is a flow diagram of the preferred methodology for fabricating the superconductor shown in FIG. 9B.

Referring to FIGS. 1 and 10, at 52, the trilayer 10 shown in FIG. 1 is formed. The trilayer 10 includes a counter electrode layer 12, a tunnel barrier layer 17 and a base electrode layer 18 formed on an oxide base layer 20. The tunnel barrier layer 17 is formed from a thin $Al_2O_3$ film layer 14 and an aluminum film layer 16. The counter electrode layer 12 and the base electrode layer 18 may be formed from a refractory metal, such as, for example, niobium. However, other superconductor alloys, compounds, metals or materials that can be anodized such as, for example, niobium nitride (NbN), may be used for the counter electrode layer 12 and the base electrode layer 18. As those skilled in the art should appreciate, the trilayer 10 is formed by in-situ deposition of niobium and aluminum on the oxide base layer 20, oxidation of the aluminum and in situ deposition of more niobium. The thickness of the counter electrode layer 12 may be, for example, 100 nm. The thickness of the thin $Al_2O_3$ film layer 14 and the layer of aluminum 16 may be, for example, 1 nm and 7 nm, respectively. The thickness of the base electrode layer 18 may be, for example, 150 nm. The oxide base layer 20 provides a base dielectric layer for electrically isolating the trilayer 10 from lower layers of circuitry that are not shown in the drawings.

Figure 2:
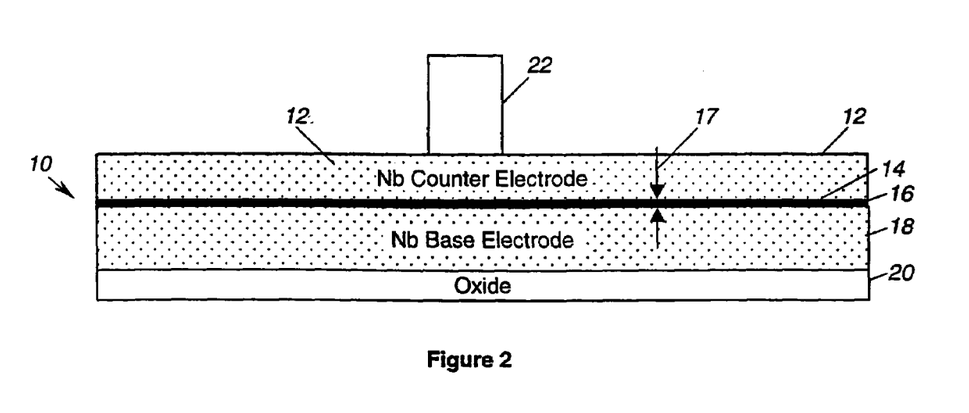
FIG. 2 is a cross-section side elevation view of the trilayer with a first mask applied thereon to define a junction according to the preferred methodology.

Referring now to FIGS. 2 and 10, at 54, the counter electrode layer is masked by a JUNCM mask (first junction mask) 22. As those skilled in the art should appreciate, the first junction mask 22 is applied by placing a thin film of photoresist over the counter electrode layer 12 and using photolithography techniques to develop an image of the first junction mask 22 on the thin film of photoresist so that only the photoresist pattern of the first junction mask 22 shown in FIGS. 2–4 remains.

Figure 3:
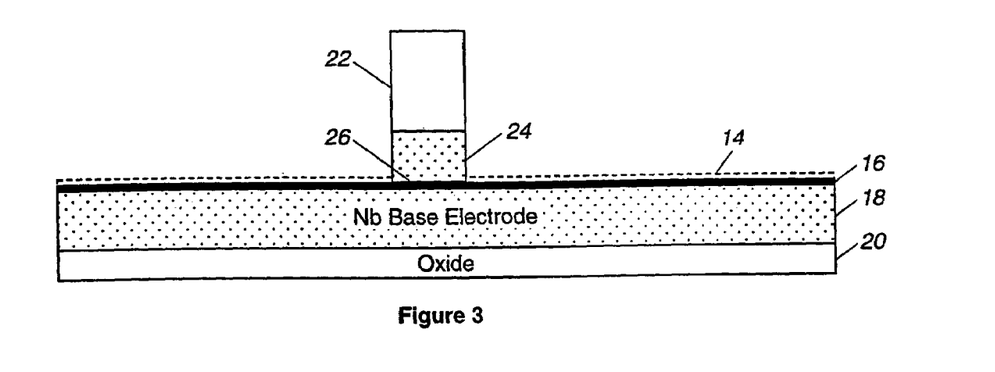
FIG. 3 is a cross-section side elevation view of the trilayer subsequent to etching over the first junction mask according to the preferred methodology.

Referring to FIGS. 3 and 10, at 56, the counter electrode layer 12 is etched while the first junction mask 22 remains thereon. The etching may be done by, for example, reactive ion etching with $SF_6$. As shown in FIG. 3, the entire counter electrode layer 12 is etched away except for a portion of the counter electrode layer disposed below the first junction mask 22. The remaining counter electrode portion will be referred to as the unetched counter electrode portion 24. The reactive ion etching will stop at the tunnel barrier layer 17 because $SF_6$ does not substantially etch aluminum or aluminum compounds. Because of the etching of the counter electrode layer 12, the entire tunnel barrier 17 except for a portion disposed below the unetched counter electrode portion 24 is exposed. The unetched counter electrode portion 24, unexposed portion 26 of the tunnel barrier layer 17 and an upper portion of the base electrode facing an inner periphery surface of the unexposed portion 26 will be referred to as the tunnel junction region 27 (see FIG. 4).

Figure 4:
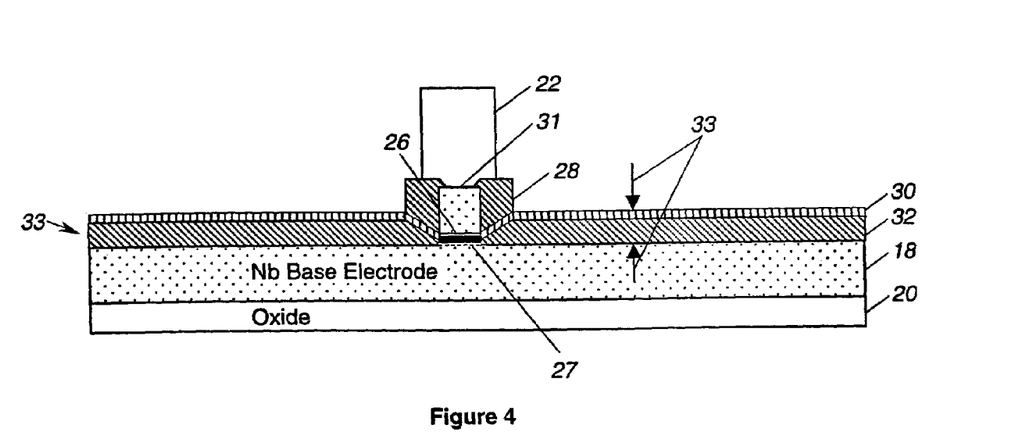
FIG. 4 is a cross-section side elevation view of the trilayer subsequent to anodizing over the first junction mask according to the preferred methodology.

Referring to FIGS. 4 and 10, at 58, the exposed portion of the tunnel barrier layer 17 and sidewall portions of the unetched counter electrode portion 24 are anodized to a predetermined voltage. Anodization is performed using the first junction mask 22 to mask a top surface of the unetched counter electrode portion 24. As shown in FIG. 4, the anodizing converts the niobium of the unetched counter electrode portion 24 to and $Nb_2O_5$ electrode (anodized counter electrode) 28 and the tunnel barrier layer 17 to an $Al_2O_3$ barrier (anodized tunnel barrier) 30. The anodization will continue through the tunnel barrier layer 17 into the underlying niobium base electrode layer 18. A portion of the niobium base electrode layer 18 will also be anodized and converted to an $Nb_2O_5$ layer (anodized base electrode) 32. The amount of the niobium base electrode layer 18 that is anodized will depend upon the predetermined voltage used during anodization. Preferably, the predetermined voltage will be in the range of 15 to 30 volts for forming an anodization layer of $Al_2O_3/Nb_2O_5$ having a thickness of approximately 40 nm. The anodized counter electrode 28, anodized tunnel barrier 30 and anodized base electrode 32 together will be referred to as an anodization layer 33 (see FIG. 4). A top surface of the tunnel junction region 27 will define a junction contact 31. After the anodizing, the junction contact 31 will have a diameter of 1.0 µm or less in accordance with generally accepted design rules.

Figure 5:
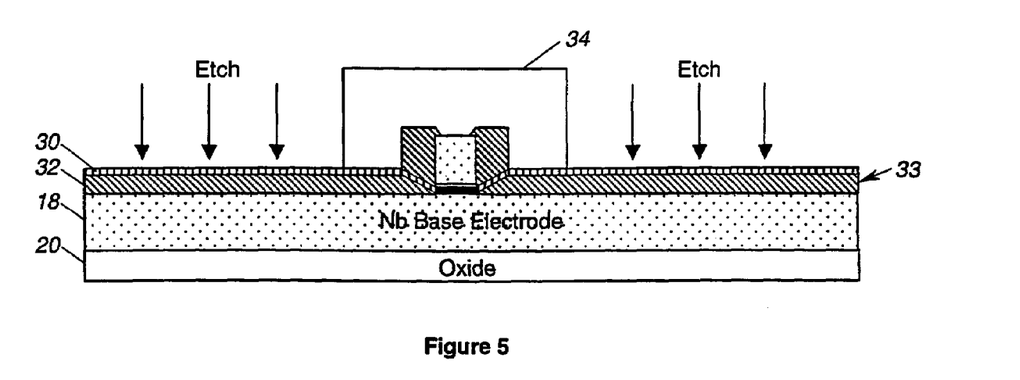
FIG. 5 is a cross-section side elevation view of the trilayer with a second junction mask applied thereon according to the preferred methodology.
Figure 6:
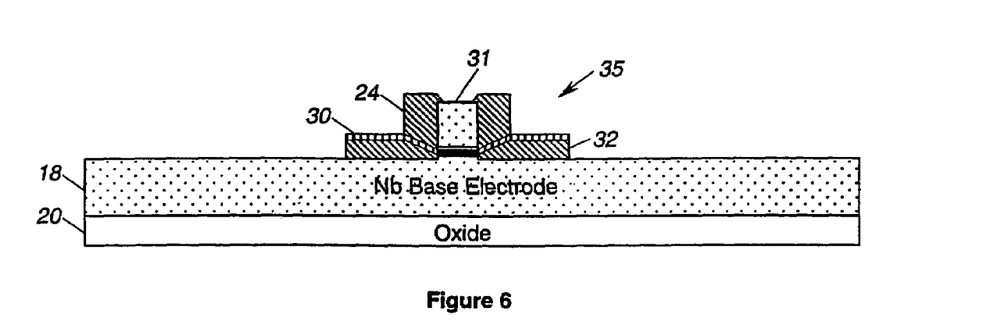
FIG. 6 is a cross-section side elevation view of the trilayer subsequent to etching over the second junction mask according to the preferred methodology.

Referring to FIGS. 5, 6 and 10, at 60, an anodization ring 35 is formed from the anodization layer 33. Initially, the first junction mask 22 is removed by conventional photoresist removal techniques. For example, a liquid or dry resist stripper may be used to remove the first junction mask 22. Then, as shown in FIG. 5, an anodization ring mask (second junction mask) 34 is applied over the anodization layer 33 and the tunnel junction region 27. The second junction mask 34 is preferably also a photoresist so that it can be applied by conventional photolithography techniques. Depending on the accuracy of the lithography tool alignment, the second junction mask 34 may be approximately 0.5 to 0.8 µm larger than the first junction mask. To be consistent with design rules, the second junction mask 34 must not be so large that the anodization ring 35 resulting from the etching discussed below has a distance between the outer perimeter of the junction and the anodization ring edge greater than 0.8 µm.

At 62, the anodization layer 33 is subsequently etched over the second junction mask 34. More specifically, an outer portion of the anodization layer 33 not protected by the second junction mask 34 is etched down to the base electrode layer 18 as shown in FIG. 6. The unetched portion of the anodization layer 33 forms the anodization ring 35 surrounding the tunnel junction region 27. The etching of the anodization layer 33 is preferably done within a reactive ion etch tool or chamber (not shown) by a two step selective etching process. The first step removes or "breaks through" the $Al_2O_3$ of the anodized tunnel barrier 30 by using a chlorine or $CHF_3$-argon based reactive ion etch. The second step etches the $Nb_2O_5$ of the anodized base electrode layer 32 down to the surface of the base electrode layer 18 with a reactive ion etch chemical mixture having a high selectivity to niobium.

An exemplary $CHF_3$-argon based reactive ion etch chemical mixture for the first step is 10 sccm $CHF_3$, 2 sccm $O_2$, 20 sccm argon. Etching with this reactive ion etch chemical mixture will be performed within the etch chamber at a pressure of approximately 25 mTorr and at a power of approximately 300 W. The large content of argon assists in the removal of $Al_2O_3$ by sputter etching (mechanical bombardment).

An exemplary high selectivity reactive ion etch chemical mixture for the second step is composed of 100 sccm $CHF_3$ and 2 sccm $O_2$. Etching with this high selectivity reactive ion etch chemical mixture is performed at a pressure of approximately 100 mTorr and at a power of approximately 150 W. Use of this high selectivity reactive ion etch chemical mixture will result in an etch rate of approximately 11 nm/s and will achieve a 4:1 selectivity with respect to niobium.

Other etch chemistries may be used for performing the two step etch process. For example, a wet etch chemical mixture such as, for example, a dilute mixture of HF, nitric acid and deionized water may be used as the etch chemical mixture of the first step followed by the selective reactive ion etch for the $Nb_2O_5$ removal. Also, a single etch step may be used rather than the two step etch process. In this case, a single wet etch such as the HF may be used. However, wet etches may undercut the photoresist masks, which will lead to poor control of critical dimensions.

Figure 7A:
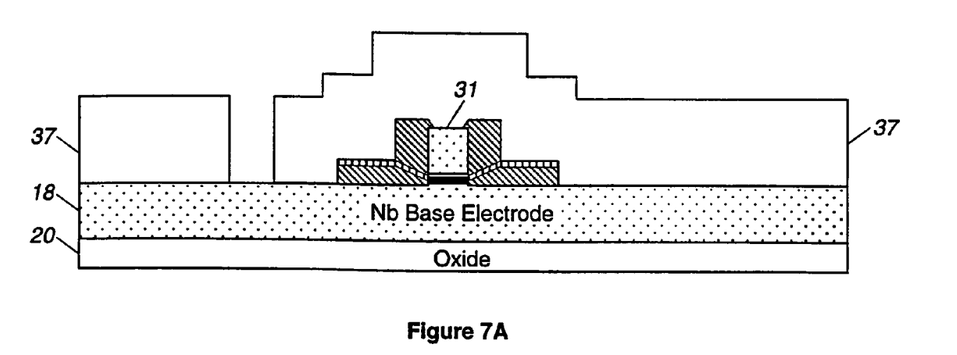
FIG. 7A is a cross-section side elevation view of the trilayer with a third junction mask applied thereon according to the preferred methodology.
Figure 7B:
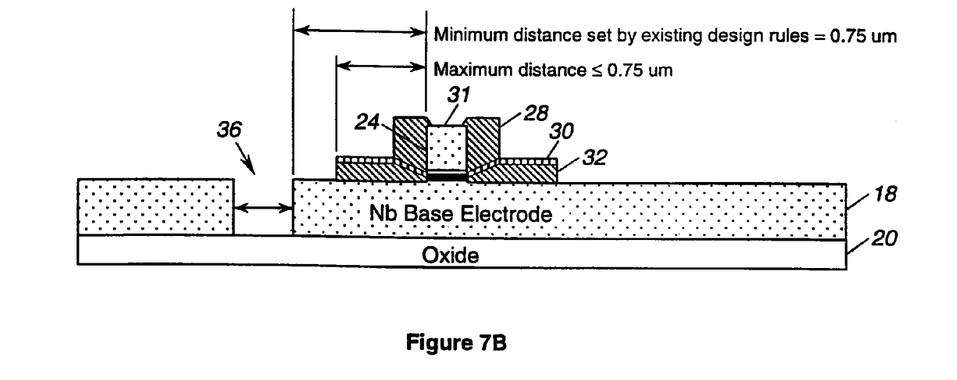
FIG. 7B is a cross-section side elevation view of the trilayer subsequent to etching over a third junction mask according to the preferred methodology.

Referring to FIGS. 7A, 7B and 10, at 64, the base electrode layer 18 is masked by a TRIW mask (third junction mask) 37. This third junction mask 37 exposes a portion, referred to hereinafter as an electrode isolation region 36, of the base electrode layer 18 that will be removed by etching (See FIG. 7B). In accordance with generally accepted design rules, the distance between the outer perimeter of the junction contact 31 and the edge of the electrode isolation region 36 should be no less than 0.8 µm for providing device isolation. At 66, the base electrode layer 18 is subsequently etched over the third junction mask 37 to remove the base electrode and to define the electrode isolation region 36.

Figure 8A:
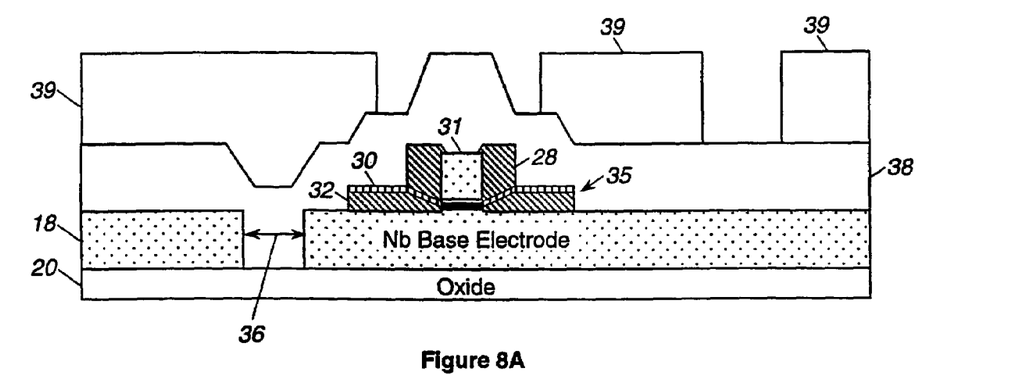
FIG. 8A is a cross-section side elevation view of the trilayer with an oxide layer and a fourth junction mask applied thereon according to the preferred methodology.

Referring to FIGS. 8A and 10, at 68, an oxide layer 38 is deposited over the base electrode layer 18, the electrode isolation region 36 and the anodization ring 35 for forming a dielectric layer 38. The deposition may be done by conventional oxide deposition techniques such as, for example, sputtering. Because the oxide layer 38 fills the etched electrode isolation region 36, the oxide will provide device isolation between the tunnel junction region 27 and another device (not shown) that may be fabricated to the left of the superconductor 1 (FIG. 9B) on the same oxide base layer 20.

Figure 8B:
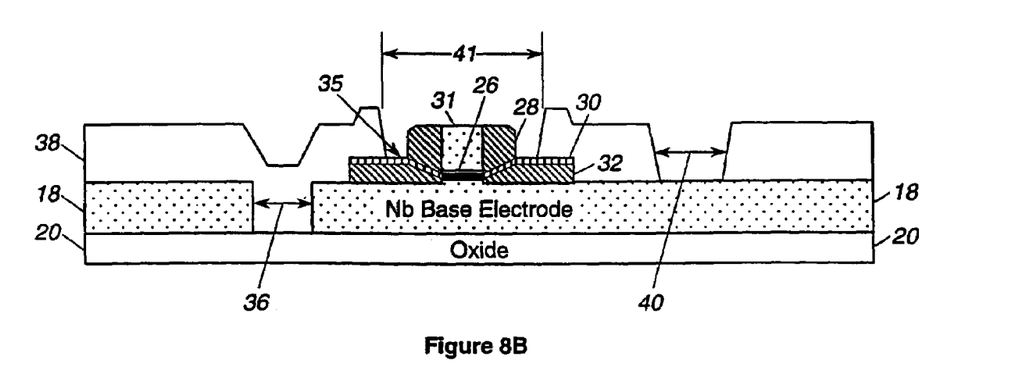
FIG. 8B is a cross-section side elevation view of the trilayer subsequent to etching an oxide layer deposited over the trilayer.

At 70, the dielectric layer 38 is masked by an SIOA mask (fourth mask) 39 as shown in FIG. 8A. The fourth mask 39 will expose a portion to the right of the anodization ring 35 for defining a base electrode contact via 40 (FIG. 8B). The fourth mask 39 will also expose portions of the dielectric layer 38 disposed above the junction contact 31, the anodized counter electrode 28 and a portion of the anodized tunnel barrier layer 30 for defining an outside contact via 41 (FIG. 8B).

At 72, the dielectric layer 38 is etched over the fourth mask 39 for forming the base electrode via 40 and the outside contact via 41 as shown in FIG. 8B. The etching may be performed by, for example, dry etch (reactive ion etch).

During the etching of the dielectric layer 38, the anodized tunnel barrier 30 functions as an etch stop for protecting the anodized base electrode layer 32. This is because the dry etch will not substantially etch the $Al_2O_3$ during the etching of the dielectric layer 38. Also, the diameter of the outside contact via 41 may be equal to or greater than the diameter of the junction contact 31. This is because the anodization ring 35, which surrounds the tunnel junction region 27, will prevent an unwanted short circuit between an outside contact and the base electrode layer 18.

Figure 9A:
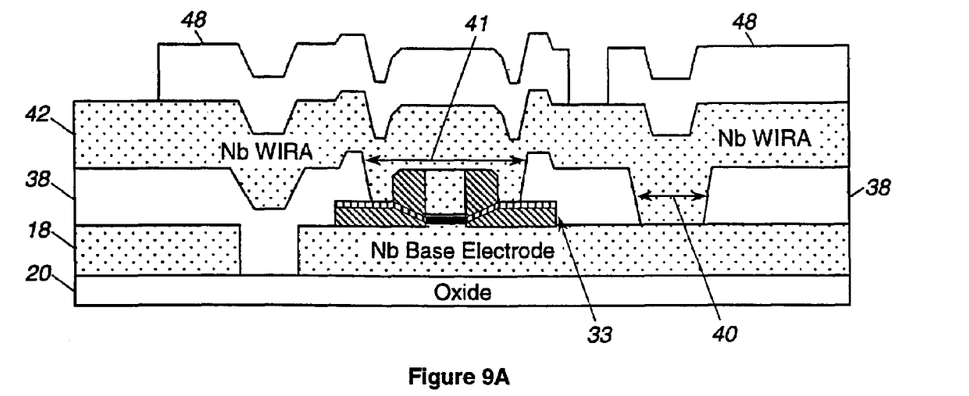
FIG. 9A is a cross-section side elevation view of the trilayer with a wire layer and a fifth junction mask applied thereon according to the preferred methodology.
Figure 9B:
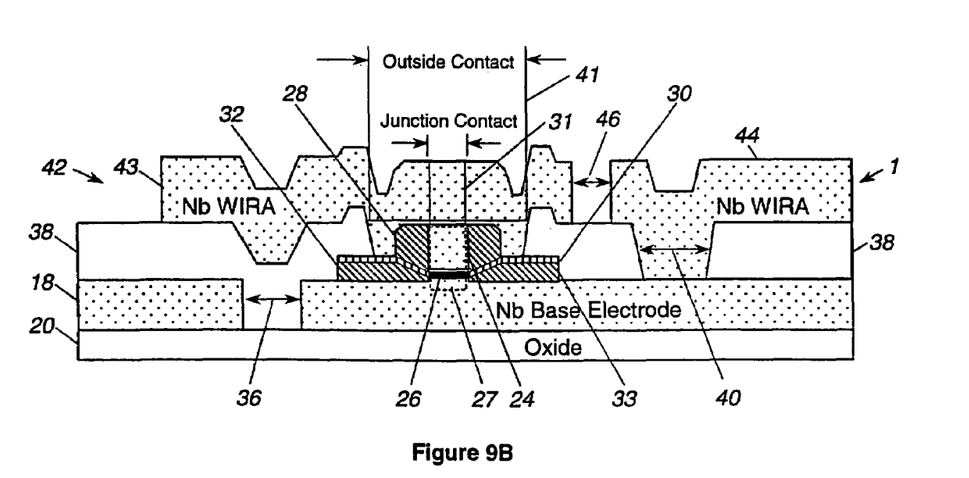
FIG. 9B is a cross-section side elevation view of the trilayer subsequent to etching a wire layer over a fifth junction according to the preferred methodology.

Referring to FIGS. 9A, 9B and 10, at 74, a wire layer 42 is deposited over the dielectric layer 38 and the anodization ring 35. At 76, the wire layer 41 is masked by a WIRA mask (fifth junction mask) 48. As shown in FIG. 9B, the fifth junction mask 48 will expose a section of the wire layer 42 for forming a trench 46 that will separate the wire layer 42 into a contact wire 43 coupled to junction contact through the outside contact via 41 and a base electrode wire 44 coupled to the base electrode layer 18 through the base electrode via 40. The wire layer is preferably composed of niobium and may be deposited by sputtering.

At 78, the wire layer 41 is etched over the fifth junction mask for forming the trench 46 as shown in FIG. 9B. The etching may be performed by, for example, reactive ion etching with $SF_6$. Additional wire layers (not shown) may be added to the superconductor 1 according to its intended use.

The superconductor 1 fabricated by the above method will be discussed with reference to FIG. 9B. The superconductor 1 includes an oxide base layer 20 for isolating the superconductor 1 from lower layers of circuitry (not shown), a niobium base electrode layer 18 disposed above the oxide base layer 20, an anodization ring 35 disposed above the base electrode layer 18, a tunnel junction region 27 that is surrounded by the anodization ring 35, a dielectric layer 38 disposed above the base electrode layer 18 and also above a portion of the anodization ring 35, and a wire layer 42 disposed above the dielectric layer 38 and the anodization ring 35.

The base electrode layer 18 is electrically coupled to a base electrode wire layer 44 of the wire layer 42 for providing external electrical communication with the tunnel junction region. The base electrode layer 18 is patterned to create isolated regions of base electrode 18 in conjunction with the dielectric layer 38. The dielectric in the base electrode isolation region 36 electrically isolates the tunnel junction region 27 from other devices (not shown). In accordance with the generally accepted design rules, the dielectric in the electrode isolation region 36 is disposed approximately 0.8 µm in horizontal distance from the junction contact 31 mentioned below.

The dielectric layer 38 is patterned to include a base electrode via 40 in conjunction with the base electrode wire layer 18 and an outside contact via 41 in conjunction with the contact wire layer 43. Because a portion of the dielectric layer 38 is disposed above the base electrode layer 18 and an outer portion of the anodization ring 35, the dielectric layer 38 helps prevent unwanted short circuits between the contact wire layer 42 and the base electrode layer 18.

The anodization ring 35 is composed of anodized niobium 28 ($Nb_2O_5$) from an etched counter electrode layer 12 (see FIG. 1), anodized aluminum ($Al_2O_3$) from an anodized tunnel barrier layer 30 and anodized niobium 32 from an anodized portion of the base electrode layer 18. The anodized aluminum 30 also prevents a short circuit between the contact wire 42 and the base electrode layer 18.

The tunnel junction region 27 is defined by the unetched portion (unetched counter electrode portion) 24 of the counter electrode layer 12, unexposed tunnel barrier layer 26 and an upper portion of the base electrode layer 18 disposed below and facing the inner periphery of the unexposed tunnel barrier layer 26. A junction contact 31 is also defined by a top surface of the unetched counter electrode portion 24. The junction contact 31 preferably has a diameter of approximately 1 µm or smaller, which is the minimum junction contact diameter permitted by generally accepted design rules.

As those skilled in the art will appreciate, a Josephson junction is formed within the tunnel junction region 27 by the unexposed tunnel barrier layer 26 being sandwiched between the unetched counter electrode portion 24 and the base electrode layer 18. As shown in FIG. 6, sidewall portions of the Josephson junction are passivated by the anodization ring 35. More specifically, referring back to FIG. 9B, when current is delivered to the Josephson junction through an outside contact that is electrically coupled to the junction contact 31 by the contact wire layer 43, the anodization ring 35 prevents a short circuit between the wire layer 34 and the base electrode layer 18.

The wire layer 41 includes a trench 46 for separating the wire layer 42 into the contact wire layer 43 and a base electrode wire layer 44. As mentioned above, current is delivered to the Josephson junction by the contact wire 42. Also, a potential of the base electrode can be determined by the base electrode wire layer 44.

Therefore, the present invention provides a novel superconductor 1 having a junction contact diameter that is the minimum size permitted by the generally accepted design rules (approximately 1.0 µm or less) and an outside contact diameter that is equal to or greater than the junction contact diameter. An anodization ring 35 disposed around the tunnel junction region 27 prevents an unwanted short circuit between the outside contact 41 and the base electrode layer 18. Because the junction diameter is the minimum size, it leads to an increased critical current density and higher circuit speed.

The superconductor 1 also has the novel feature of an electrode isolation region 36 that is the minimum horizontal distance from the junction contact 31 permitted by generally accepted fabrication rules (approximately 0.8 µm or smaller).

Also, the present invention provides a novel method for fabricating the above superconductor 1. The etching of the counter electrode layer 12 and the anodizing of the unetched counter electrode, tunnel barrier layer and base electrode layer are preferably performed using the same junctions mask, thereby simplifying the fabrication process. Also, the anodization layer is preferably etched using a two step etch process for forming the anodization ring.

While the above description is of the preferred embodiment of the present invention, it should be appreciated that the invention may be modified, altered, or varied without deviating from the scope and fair meaning of the following claims.

The invention claimed is:
1. A superconductor integrated circuit comprising:
a base electrode layer;
a tunnel barrier layer disposed above the base electrode layer, the tunnel barrier layer having a lateral surface portion;
a counter electrode layer disposed above the tunnel barrier layer; and
an anodization ring disposed around a perimeter of the counter electrode layer and a perimeter of the tunnel barrier layer for preventing a short-circuit between an outside contact and the base electrode layer,
wherein:
a tunnel junction region is defined by the counter electrode layer, the tunnel barrier layer and the base electrode layer, the tunnel junction region including a junction contact defined by a top surface of the counter electrode, the junction contact having a diameter of approximately 1.00 µm or less; and
the anodization ring includes an anodized portion of the counter electrode layer, an anodized portion of the lateral surface portion of the tunnel barrier layer and an anodized portion of the base electrode layer.

2. The superconductor integrated circuit of claim 1, wherein the base electrode includes an electrode isolation region disposed approximately 0.8 µm or less in horizontal distance from the junction contact for providing device isolation.

3. The superconductor integrated circuit of claim 1, further comprising
a patterned oxide layer disposed above the base electrode layer and the anodization ring for defining an outside contact via and a base electrode via, wherein a surface area of the outside contact via is greater than a surface area of the junction contact.

4. The superconductor integrated circuit of claim 3, further comprising a wire layer disposed above the oxide layer for providing an outside contact and a base electrode contact, wherein a surface area of the outside contact is greater than a surface area of the junction contact.

5. The superconductor integrated circuit of claim 1, wherein the counter electrode layer is disposed solely within the anodization ring.

6. The superconductor integrated circuit of claim 1, wherein the tunnel barrier layer is disposed solely within the anodization ring.

7. The superconductor integrated circuit of claim 1, wherein:
the base electrode layer and the counter electrode layer are comprised of niobium;
the tunnel barrier layer is comprised of a layer of aluminum and a layer of $Al_2O_3$ disposed above the layer of aluminum; and
the anodization ring is comprised of $Al_2O_3$ and $Nb_2O_5$.

8. The superconductor integrated circuit of claim 1, wherein the anodized portion of the counter electrode layer extends upwardly around the perimeter of the counter electrode layer from the anodized portion of the tunnel barrier layer and the anodized portion of the base electrode layer, an associated diameter of the anodized portion of the counter electrode layer being less than an associated diameter of the anodized portion of the tunnel barrier layer and the anodized portion of the base electrode layer.

9. A superconductor integrated circuit comprising:
a base electrode layer;
a tunnel barrier layer disposed above the base electrode layer;
a counter electrode portion disposed above an unexposed portion of the tunnel barrier layer; and
an anodization ring disposed around a perimeter of the counter electrode portion and around the unexposed portion of the tunnel barrier layer for preventing a short-circuit between an outside contact and the base electrode layer, the anodization ring including an anodized portion of the tunnel barrier layer anodized from an exposed portion of the tunnel barrier layer;
wherein:

a tunnel junction region is defined by the counter electrode layer, the unexposed portion of the tunnel barrier layer and the base electrode layer, the tunnel junction region including a junction contact defined by a top surface of the counter electrode, the junction contact having a diameter of approximately 1.00 µm or less; and the anodization ring further includes an anodized portion of the counter electrode layer and an anodized portion of the base electrode layer, the anodized portion of the counter electrode layer extending upwardly around the perimeter of the counter electrode layer from the anodized portion of the tunnel barrier layer and the anodized portion of the base electrode layer, an associated diameter of the anodized portion of the counter electrode layer being less than an associated diameter of the anodized portion of the tunnel barrier layer and the anodized portion of the base electrode layer.

10. A superconductor integrated circuit comprising:

a base electrode layer;

a tunnel barrier layer disposed above the base electrode layer;

a counter electrode portion disposed above an unexposed portion of the tunnel barrier layer; and an anodization layer formed from at least a portion of the base electrode layer and an exposed lateral surface portion of the tunnel barrier layer and an anodization ring disposed laterally around a perimeter of the counter electrode portion and around the unexposed portion of the tunnel barrier layer for preventing a short-circuit between an outside contact and the base electrode layer, wherein:

a tunnel junction region is defined by the counter electrode layer, the unexposed portion of the tunnel barrier layer and the base electrode layer, the tunnel junction region including a junction contact defined by a top surface of the counter electrode, the junction contact having a diameter of approximately 1.00 µm or less; and the anodized portion of the counter electrode layer extends upwardly around the perimeter of the counter electrode layer from the anodized portion of the tunnel barrier layer and the anodized portion of the base electrode layer, an associated diameter of the anodized portion of the counter electrode layer being less than an associated diameter of the anodized portion of the tunnel barrier layer and the anodized portion of the base electrode layer.

11. A superconductor integrated circuit comprising:

a base electrode layer;

a tunnel barrier layer disposed above the base electrode layer;

a counter electrode layer disposed above the tunnel barrier layer; and an anodization ring disposed around a perimeter of the counter electrode layer and a perimeter of the tunnel barrier layer for preventing a short-circuit between an outside contact and the base electrode layer, wherein:

a tunnel junction region is defined by the counter electrode layer, the tunnel barrier layer and the base electrode layer, the tunnel junction region including a junction contact defined by a top surface of the counter electrode, the junction contact having a diameter of approximately 1.00 µm or less;

the anodization ring includes an anodized portion of the counter electrode layer, an anodized portion of the tunnel barrier layer and an anodized portion of the base electrode layer; and the anodized portion of the counter electrode layer extends upwardly around the perimeter of the counter electrode layer from the anodized portion of the tunnel barrier layer and the anodized portion of the base electrode layer, an associated diameter of the anodized portion of the counter electrode layer being less than an associated diameter of the anodized portion of the tunnel barrier layer and the anodized portion of the base electrode layer.

* * * * *